United States Patent [19]

Greeninger

[11] 3,769,823

[45] Nov. 6, 1973

[54] COMPONENT LEAD CUTTING AND BENDING APPARATUS

[75] Inventor: Marvin J. Greeninger, Coon Rapids, Minn.

[73] Assignee: Lectro Precision Tools, Inc., Eden Praire, Minn.

[22] Filed: Mar. 31, 1971

[21] Appl. No.: 129,895

[52] U.S. Cl. .................... 72/24, 29/203 D, 72/335, 72/DIG. 10

[51] Int. Cl. .................... B21j 3/26, B21d 31/00

[58] Field of Search .................... 72/DIG. 10, 328, 72/326, 335, 24; 29/203 D

[56] References Cited

UNITED STATES PATENTS

| | | | |
|---|---|---|---|
| 3,128,820 | 4/1964 | Hoyt | 72/335 |
| 2,867,262 | 1/1959 | Aiorsworth | 72/DIG. 10 |
| 3,028,886 | 4/1962 | Drukker | 72/DIG. 10 |
| 3,002,538 | 10/1961 | Wilson | 72/DIG. 10 |

*Primary Examiner*—Charles W. Lanham
*Assistant Examiner*—R. M. Rogers
*Attorney*—Thomas G. Devine

[57] ABSTRACT

A device for rapidly cutting and bending the leads of an electronic component so that the component is ready for placement on a printed circuit board. The apparatus includes a moveable blade and a stationary blade for cutting, the moveable blade alone for bending, and a component holder which is capable of holding a plurality of components. After the leads of the components have been cut and bent, an ejector system provides ample space for the components to be removed by striking the bent leads with an ejector bar after having moved the component holder away from the components to provide space so that the components are able to fall to a tray at the bottom after having been removed from a center block about which the leads had been formed by the action of the ejector bar.

5 Claims, 4 Drawing Figures

INVENTOR.

Marvin J. Greeninger

BY

Thomas G. Devine

ATTORNEY

Patented Nov. 6, 1973 3,769,823

2 Sheets-Sheet 2

INVENTOR.
Marvin J. Greeninger
BY
Thomas G. Devine
ATTORNEY

COMPONENT LEAD CUTTING AND BENDING APPARATUS

BACKGROUND OF THE INVENTION

This invention relates to automatic machinery for forming components for placement on printed circuit boards, and particularly to devices for high-speed forming. High speed is achieved in this invention by the forming of a multiplicity of components mounted together.

Prior art devices operate on one component at a time. With the proper handling mechanism, this type of operation has resulted in very high speed of cutting and bending the leads of an electronic component for subsequent insertion into appertures in a printed circuit board. This invention relies on high speed but also relies on a mechanism capable of handling many components at the same time. Not only is the speed of operation increased, but also the damage to the components is minimized. Further, the cutting and bending blade is much less susceptible to wear at any particular point. Thus the life of the apparatus is enhanced and the failure rate of the formed components is lowered.

BRIEF SUMMARY OF THE INVENTION

A vertical component holder, of a dimension proper to enclose the bodies of a plurality of vertically arrayed components is used, in conjunction with a mating center block, to define a vertical slot of a dimension proper to insure relatively firm holding of the vertically arrayed components while the axial leads of the components are cut and bent by a pair of cutting and bending shears. A moveable mechanism, opposite the cutting and shearing blades, is moved forward after being signaled by a switch which is activated by the cutting and bending blades upon their deactivation after having performed their cutting and bending function.

After the deactivation switch has been contacted, the vertically disposed component holding device is moved away from the components whose leads are bent around the face and sides of the mating block. An ejector bar, of a general "U-shape", is moved toward the components so that the bent leads of the component are contacted by the legs of the ejector bar. Since the vertically disposed component holder has been moved away from the components, the components are free to drop into a tray at the bottom of the device after having been pushed off of the mating block by the ejector bar.

The device is provided with a chute for handling the components. The components are commonly stored in the perforations of a perforated cardboard strip, on a reel of tape with the bodies of the components adhering to the tape, or on a double reel of tape with each of the leads of the component adhering to one of the reels of tape. The components are disposed in a parallel fashion with each other, one on top of the other in a column wherein the components are horizontally disposed. A pin projecting from the component holder, located toward the bottom of the holder, retains the components until after the cutting and bending operation has been completed. After the cutting and bending has been accomplished, the component holder moves away from the components thereby moving the pin away from the components and permitting a free drop to the collection pan at the bottom of the device when the ejection mechanism pushes the components off of the mating block.

The components are generally parallel to each other when they are in place for cutting and bending, but it must be realized that they are by no means in the precise relative position each time new components are introduced. The cutting and bending blade therefore does not cut and bend at exactly the same positions each time. This results in less wear on the cutting and bending blades. It should also be noted that the cutting and bending blades are not straight in a vertical direction. Instead they have been formed to provide an apex at the vertical center. This contour provides for more or less independent lead cutting and bending for each component, providing less shock to the components themselves and to the apparatus.

Therefore, an object of this invention is to provide very rapid cutting and bending of component leads for ultimate insertion into printed circuit boards.

Another object is to provide a very gentle means of handling the components for such bending and cutting.

Still another objective is to very efficiently and economically form the leads of components for subsequent use.

Still another objective is to provide apparatus for cutting and bending the leads of a substantial number of components in near simultaneous fashion.

Another object of this invention is to provide a mechanism for automatically ejecting the plurality of components after their leads have been cut and bent by the apparatus.

A further objective is to provide a device for forming components which is not easily damaged and worn by continued use.

These and other objects will become more apparent in the description that follows:

DETAILED DESCRIPTION OF THE INVENTION

Figure 1:
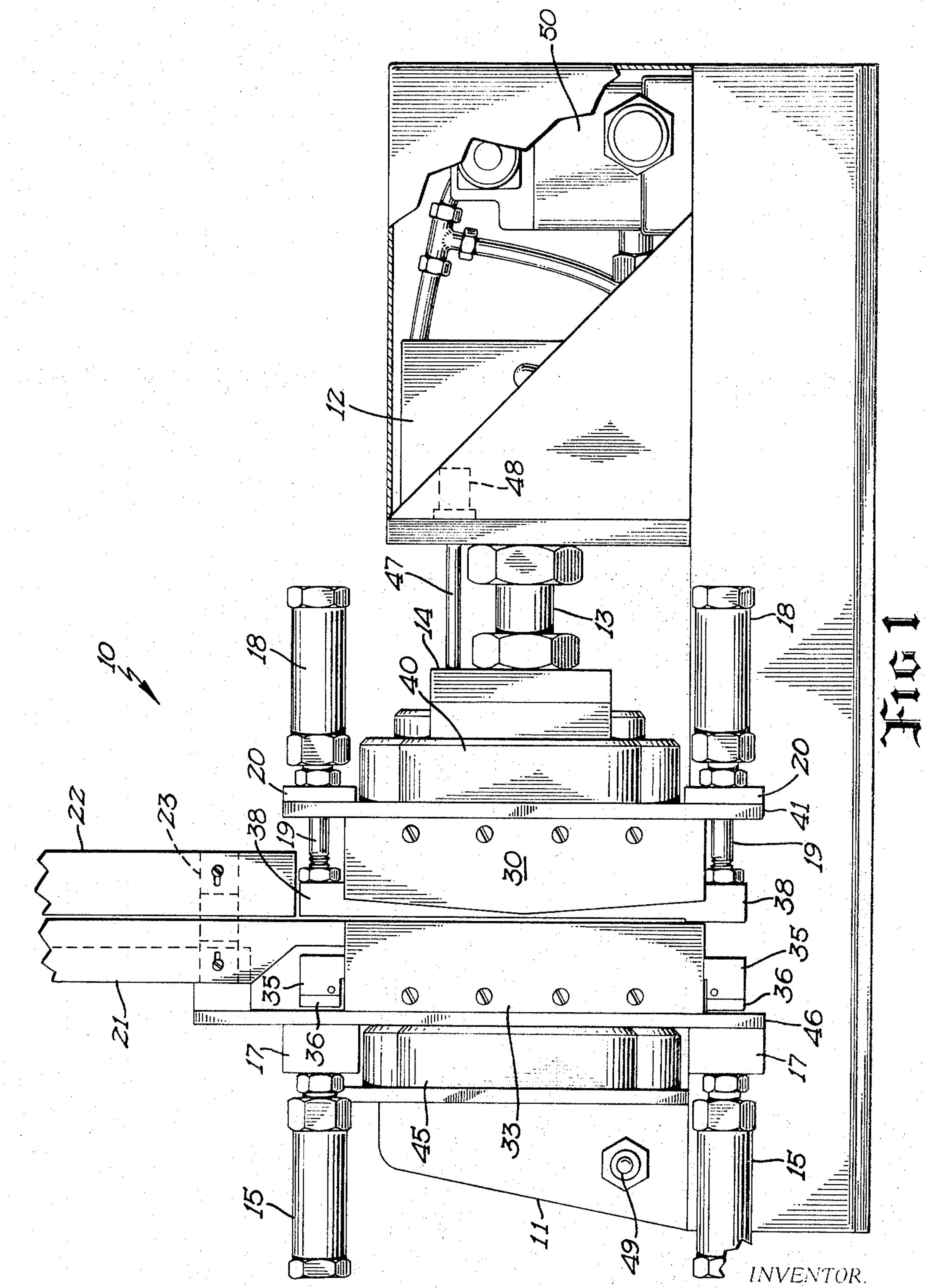
FIG. 1 is a side elevation, with partial cutaway sections to illustrate essential features of the apparatus.

FIG. 1 is a side elevation of the component cutting and bending apparatus 10. A frame 11 supports a drive cylinder 12 having a shaft 13 and a block 14, a pair of ejector cylinders 15, each connected to an ejector block 17, and a pair of retractor cylinders, each having a shaft 19 and connected to a block 20.

The drive cylinder block 14 is connected to the drive housing 40 which in turn is connected to the drive housing plate 41.

The pair of ejector cylinder blocks 17 are attached to an ejector housing plate 46 which in turn is connected to ejector housing 45. A pair of outside shears 33, parallelly disposed to each other, is connected to the ejector housing plate 46.

Figure 2:
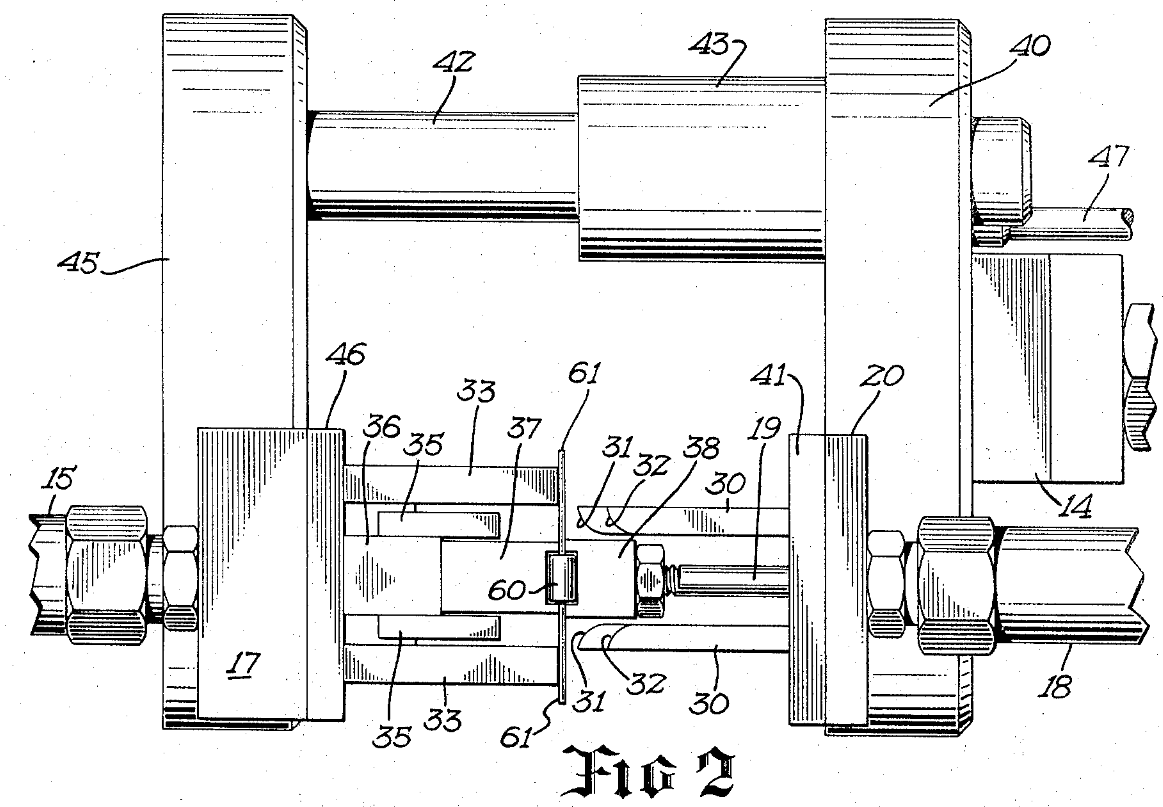
FIG. 2 is a top view of the essential features of this invention.
Figures 3, 4:
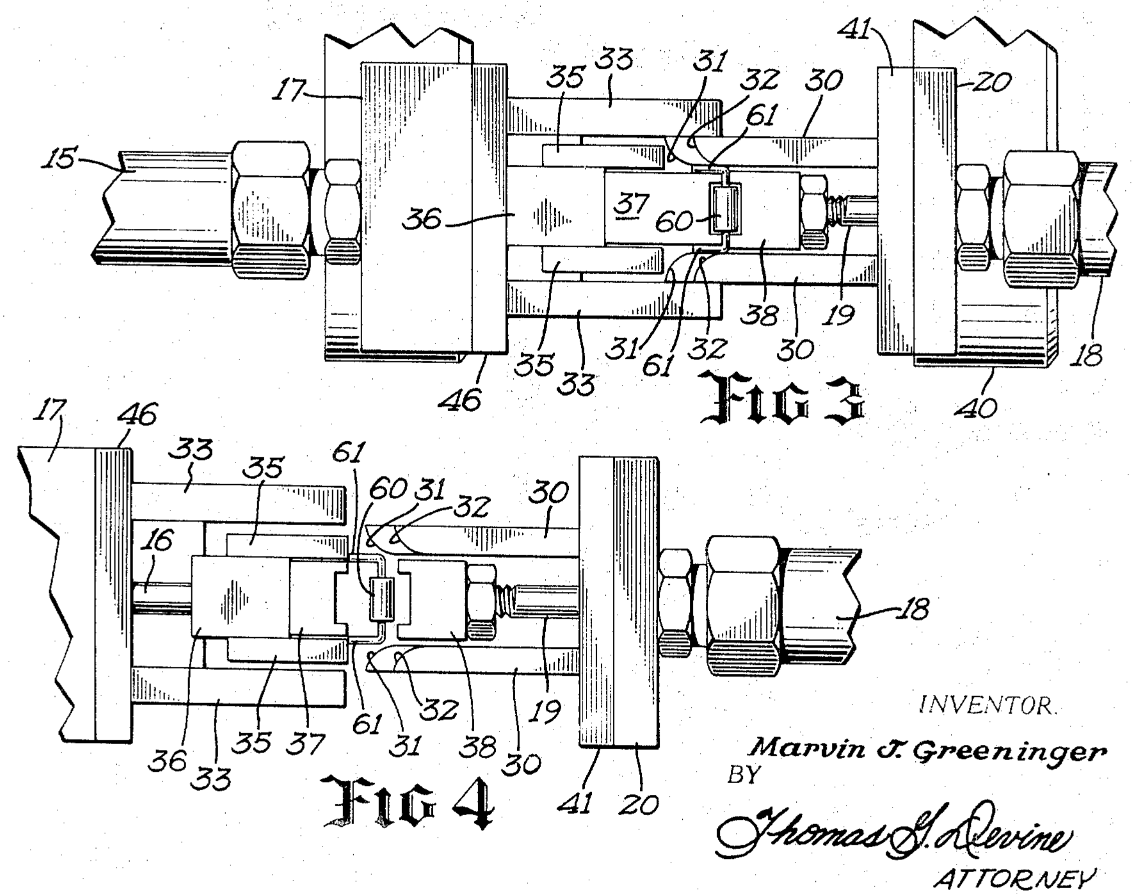
FIG. 3 is a top view of a part of the apparatus showing events subsequent in time to those of FIG. 2.
FIG. 4 is a top view of part of the apparatus showing events subsequent to those shown in FIG. 3.

An ejector bar 35 is attached to ejector bar holder 36 (see FIGS. 2, 3 and 4). The ejector cylinder shaft 16 is shown in FIG. 4 attached to the ejector bar holder 36. Another ejector cylinder shaft 16, is not shown but is directly beneath ejector cylinder 16 shown in FIG. 4 and opposite and connected to the lower ejector cylinder 15 of FIG. 1.

An inside shear 30 is shown connected to the drive housing plate 41. Another inside shear 30, is shown in FIGS. 2, 3 and 4, opposite that shown in FIG. 1. A component holder 38 is shown attached to the retractor cylinder shafts 19.

A front feed chute 21 and a rear feed chute 22 define an entry for the components which are located in the corrugations of a corrugated cardboard strip, the component bodies adhered to a single roll of tape, or each lead projecting from one side of a plurality of components adhering to one roll of tape and each lead projecting from the other side of the components adhering to another roll of tape. The lowermost portion of the component strip, or the component itself, is prevented from further downward motion by a pin (not shown) projecting from the component holder 38.

An ejector switch rod 47 activates an ejector switch 48, the operation of which will be described later. A 4-way valve 50 is partially shown.

The drive cylinder 12, the ejector cylinders 15 and the retractor cylinders 18 are all of the double-acting, air type. These are well-known in the art and are graphically illustrated in "Devices and Fundamentals of Air Circuitry" by Westinghouse Air Brake Company, Copyright 1958. A 4-way air valve 50 is also illustrated in that publication. These devices are well-known in the art and need not be described in detail here. They could be spring retracted air cylinders, they could be fluid devices wherein a liquid medium rather than a gas is employed, they could be electrical devices, et cetera. The choice is a simple matter of engineering design.

Referring now to FIG. 2, it can be seen that the drive housing 40 may be propelled in the direction of component 60, moved along drive housing guide 42 which passes through the drive housing sleeve 43. Another drive housing guide 42 and a corresponding drive housing sleeve 43 are located directly beneath those shown in FIG. 2 to add strength to the mechanism for supporting the drive housing and all of its associated parts.

The component 60, having leads 61 is shown positioned between component holder 38 and center block 37. The "U-shaped" ejector bar 35 is shown attached to ejector bar holder 36 which, in FIG. 4, is shown attached to ejector cylinder shaft 16.

The inside shears 30, which are used for cutting and bending leads 61 of component 60 have cutting edges 31 and bending edges 32. The inside shears 30 are shown connected to drive housing plate 41 which is connected to drive housing 40, with the drive cylinder block 14 attached so that motion can be imparted to the inside shears 30.

FIG. 3 illustrates the mechanism described in FIG. 2, after the inside shears 30 have been moved forward to cut leads 61 of component 60 and to bend them as shown with edge 32.

FIG. 4 illustrates a still later phase in the operation, namely after drive cylinder 14 has caused the inside shears 30 to move back. The component holder 38 is illustrated as having been moved back from component 60 and the ejector bar 35 is shown having been moved against the now-bent leads 61 of component 60 by reason of ejector cylinder 15 having been activated, activating motion of ejector bar holder 36 which is connected to the moving ejector cylinder shaft 16.

MODE OF OPERATION

Referring first to FIG. 1, the components affixed to strips as previously described are inserted into the feed chutes 21 and 22. The components thereby slip into a slot defined by component holder 38 and center block 37 (see FIGS. 2, 3 and 4). The downward motion of the strip of components is stopped by a pin (not shown) projecting from component holder 38, near its lower edge and directly in the path of the component strip. The activate switch 49, and another activate switch directly opposite switch 49, but not shown, are depressed. In the preferred embodiment, both switches 49 must be depressed, as a safety feature, to provide a continuous electrical circuit (not shown) to activate the 4-way valve 50. Activation of the 4-way valve 50 provides a path for air, under pressure, to enter drive cylinder 12. The air under pressure is directed against one side of a piston of drive cylinder 12 moving drive cylinder shaft 13 to the left as viewed in FIG. 1. This results in movement to the left of drive housing 40, drive housing plate 41 and inside shears 30.

It will be helpful to now refer to FIG. 2 for a clear understanding of this invention. The inside shears 30 are shown prior to engaging the leads 61 of component 60 with the cutting edge 31. It should be noted that the leads 61 are held firmly in place so that when engaged by cutting edges 31, a minimum of strain is imparted to component 60. Cutting edge 31 cuts the leads 61 and the shears 30 continue to the left as shown in FIG. 3.

In FIG. 3, the bending edges 32 of inside shears 30 are shown engaging the cut leads 61 of component 60 and bending them in the direction of the motion of the inside shears 30. At this point the operator removes his fingers from the activate switches 49 (it is well-known that limit switches or the like could provide the same function as manually lifting the fingers from the switches 49).

Deactivating the activate switches 49 causes the valving configuration of the 4-way valve 50 to return to its original configuration, causing air under pressure to be introduced into the drive cylinder 12, but on the opposite side of the piston causing it to move in the opposite direction, pushing the air out through a now-exposed exhaust port. The motion to the right of drive housing 40 results in movement of ejector switch rod 47 which in turn depresses ejector switch 48. The ejector switch 48 in its closed position activates a time delay circuit (not shown), and also activates the 4-way valve 50 but in a configuration to deliver air under pressure to cause the retractor cylinders 18 to move the retractor cylinder shafts 19 to the right as viewed in FIG. 1. The valving configuration also provides air under pressure to the ejector cylinders 15 to cause the ejector cylinder shaft 16 to move to the right, as viewed in FIG. 4.

The activation of the retractor cylinders 18 causes a motion to the right relative to the inside shears 30. As viewed in FIG. 4, the component holder 38 has been moved to the right, away from component 60 by reason of the motion of retractor cylinder shaft 19. As an integral part of component holder 38, a retaining pin (not shown) at the bottom edge of component holder 38 also is moved away.

Activation of the ejector cylinders 15 results in a rightward motion of ejector cylinder shafts 16 which are attached to the ejector bar holder 36. The movement of ejector bar holder 36 causes ejector bar holder 35 to move to the right and to strike the bent leads 61 of component 60 thereby pushing the leads 61 off of center block 37. The large gap between center block 37 and component holder 38, resulting from the rightward motion of component holder 38, provides a large space through which component 60 may fall to a collection tray (not shown) at the bottom of the device.

At the end of an approximate 5-second delay caused by the time delay circuit, the 4-way valve is again activated, back to its initial position, thereby supplying air under pressure to the other side of the pistons of the ejector cylinders 15 and the retractor cylinders 18 returning all mechanisms to their original state for recycling.

The preferred embodiment as herein shown is not intended to be limiting in character. That is, limit switches can replace the function of a timing device, they can replace manual operations and the power units need not be air cylinders. Those skilled in the art are aware of many variations of an engineering nature which can be made within the spirit of my invention.

I claim:

1. A component handling device for forming a component having leads comprising:

a frame;

cutting means comprising an outside shear mounted on the frame;

a component holder moveably mounted on the frame, formed with an aperture to partially accept the component;

a center block, mounted on the frame, adjacent the component holder, formed with an aperture to partially accept the component and positioned against the component holder with the component in place with the corresponding apertures, with the leads of the component held between the component holder and the center block, outside the apertures of each;

moveable cutting and bending means comprising an inside shear slideably mounted on the frame in shearing registration with the outside shear for cutting the component leads and bending the component leads against the center block;

a first power source mounted on the frame and attached to the cutting and bending means to move the cutting and bending means into contact with the component leads;

ejector means, mounted on the frame, for ejecting the component from the device after the leads of the component have been bent and cut; and a second power source, mounted on the frame and attached to the component holder, for moving the component holder away from the center block to provide space to eject the component by the ejector means.

2. The device of claim 1 wherein the ejector means further comprise:

k. an ejector bar, moveably mounted on the frame, configured to strike the ends of the component leads after the leads have been bent; and l. a third power source mounted on the frame and connected to the ejector bar to move the ejector bar into contact with the ends of the component leads.

3. The device of claim 1 further comprising control means mounted on the frame and operatively connected to the first and second power sources to selectively control the operation of the first power source and the second power source.

4. A component handling device for forming a plurality of components, each having leads, comprising:

a frame;

cutting means comprising an outside shear mounted on the frame;

a component holder moveably mounted on the frame, formed with an aperture to partially accept the component;

a center block, mounted on the frame, adjacent the com-ponent holder, formed with an aperture to partially accept the component and positioned against the component holder with the component placed within the corresponding apertures, with the leads of the component held between the component holder and the center block, outside the apertures of each;

loading means, attached to the frame for inserting the components, and comprising a vertically supported chute of a lateral dimension sufficient to accept the components and their leads, disposed above the holding means and adjacent thereto;

moveable cutting and bending means comprising an inside shear slideably mounted on a frame in registration with the outside shear for cutting the component leads and bending the leads against the center block;

a first power source mounted on the frame and attached to the cutting and bending means to move the cutting and bending means into contact with the component leads;

ejector means, for ejecting the component after the leads of the component have been cut and bent; and a second power source mounted on the frame and attached to the component holder, for moving the component holder away from the center block to provide space to eject the component by the ejector means.

5. A component handling device for forming a plurality of components, each having leads, comprising:

a frame;

loading means, attached to the frame for inserting the components;

cutting means, mounted on the frame;

component handling means mounted on the frame, adjacent the loading means;

moveable cutting and bending means, mounted in position on the frame to make contact with the cutting means to cut the component leads and bend the component leads against the holding means:

a first power source mounted on the frame and attached to the cutting and bending means to move the cutting and bending means into contact with the component leads;

ejector means for ejecting the component comprising an ejector bar moveably mounted on the frame and configured to engage the ends of the component leads after the leads have been bent;

a third power source mounted on the frame and connected to the ejector bar to move the ejector bar into contact with the ends of the component leads.

* * * * *